(12) United States Patent
Futamura et al.

(10) Patent No.: US 7,502,595 B2
(45) Date of Patent: Mar. 10, 2009

(54) RADIO EQUIPMENT COMMUNICATABLE IN TWO FREQUENCY BANDS AND METHOD FOR GENERATING LOCAL OSCILLATOR SIGNAL IN RADIO EQUIPMENT

(75) Inventors: Kazuhiro Futamura, Kawasaki (JP); Shinsuke Shimahashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 435 days.

(21) Appl. No.: 11/492,554

(22) Filed: Jul. 25, 2006

(65) Prior Publication Data

US 2006/0276142 A1 Dec. 7, 2006

Related U.S. Application Data

(60) Division of application No. 10/817,410, filed on Mar. 30, 2004, now Pat. No. 7,130,603, which is a continuation of application No. PCT/JP01/08729, filed on Oct. 3, 2001.

(51) Int. Cl.
*H04B 1/40* (2006.01)

(52) U.S. Cl. ........................ 455/76; 455/552.1; 455/103; 455/188.1

(58) Field of Classification Search .................. 455/73, 455/75, 76, 78, 84, 552.1, 553.1, 103, 118, 455/188.1, 190.1; 331/1 R, 34
See application file for complete search history.

(56) References Cited

U.S. PATENT DOCUMENTS

| 4,518,929 | A | 5/1985 | Owen |
|---|---|---|---|
| 4,965,531 | A | 10/1990 | Riley |
| 5,374,902 | A | 12/1994 | Bradley |
| 5,497,128 | A | 3/1996 | Sasaki |
| 5,535,432 | A | 7/1996 | Dent |
| 5,610,559 | A | 3/1997 | Dent |
| 5,896,562 | A | 4/1999 | Heinonen |
| 5,983,081 | A | 11/1999 | Lehtinen |
| 6,466,803 | B1 | 10/2002 | Gardner |
| 2004/0131105 | A1* | 7/2004 | Kegasa et al. ............... 375/130 |

(Continued)

FOREIGN PATENT DOCUMENTS

DE 197 08 772 A1 6/1998

(Continued)

OTHER PUBLICATIONS

European Search Report dated Sep. 7, 2004.

(Continued)

*Primary Examiner*—Nguyen Vo
(74) *Attorney, Agent, or Firm*—Katten Muchin Rosenman LLP

(57) ABSTRACT

Radio equipment enabling radio communication with frequency conversion corresponding to signals of different frequency bands is disclosed. A local oscillator signal generator included in this radio equipment having a first signal generator, a second signal generator, and a frequency synthesizer generating a local oscillator signal. A first signal having first frequency is generated in the first signal generator, and a second signal having second frequency smaller than the first frequency is generated in the second signal generator. These first and second signals are synthesized, and the local oscillator signal either having the frequency derived from adding the second frequency to the first frequency, or having the frequency derived from subtracting the second frequency from the first frequency is generated.

2 Claims, 10 Drawing Sheets

U.S. PATENT DOCUMENTS

2006/0035599 A1 * 2/2006 Yoshida et al. ................ 455/76

FOREIGN PATENT DOCUMENTS

| GB | 2 321 353 | 7/1998 |
|----|-----------|--------|
| JP | 63-246009 | 10/1988 |
| JP | 02-143704 | 6/1990 |
| JP | 08-223073 | 8/1996 |
| JP | 2000-124739 | 4/2000 |
| JP | 2000-223956 | 8/2000 |
| JP | 57-193106 | 11/2000 |
| WO | WO 01/01562 A1 | 1/2001 |

OTHER PUBLICATIONS

Behzad Razavi. Challenges in Design of Frequency Synthesizers for Wireless Applications. IEEE 1997 pp. 395-402.

* cited by examiner

FIG. 7

1.5G BAND SETTING EXAMPLE :

LPF TIME FACTOR $\tau 1 = C \cdot R1 = 0.020\mu \cdot 19.00K = 380.0\mu$ [s]

LPF TIME FACTOR $\tau 2 = C \cdot R2 = 0.020\mu \cdot 2.200K = 44.00\mu$ [s]

FREQUENCY DIVISION NUMBER N=1,359M[Hz]/25K[Hz]=54,360

DUMPING FACTOR $\zeta$ =0.6

PHASE COMPARATOR GAIN $K_p = 3[V]/(4\pi) = 2.355$ [V/rad]

∵CONTROLLED VOLTAGE 0~3[V],

PHASE COMPARATOR RANGE $-2\pi \sim +2\pi = 4\pi$

CONTROL SENSITIVITY OF VOLTAGE CONTROLLED OSCILLATOR $K\nu$ = 8M [Hz/V] ≒ 50.24M[rad/s/V]

∴LOOP GAIN $K = (K_p \cdot K\nu)/N = (2.355 \cdot 50.24M)/54,360 = 2.177[s^{\wedge}(-1)]$ (DEPENDING ON VOLTAGE CONTROLLED OSCILLATOR)

[CALCULATION RESULT]

NATURAL ANGULAR FREQUENCY $\omega n = \{K/(\tau 1 + \tau 2)\}^{1/2} = 2.266K$[rad/s]

NATURAL FREQUENCY $Fn = 2.266K/(2\pi) = 360.8$[Hz]

∴NATURAL VIBRATION PERIOD OF PHASE CONVERGENCE LOOP

= $1/Fn = 2.772$m[s]

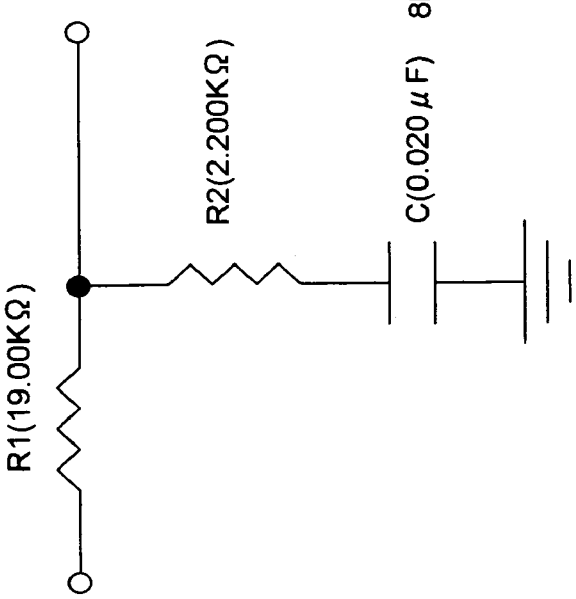

EXAMPLE OF TRANSITIONAL RESPONSE IN CASE DUMPING FACTOR $\zeta = 0.6$

RADIO EQUIPMENT COMMUNICATABLE IN TWO FREQUENCY BANDS AND METHOD FOR GENERATING LOCAL OSCILLATOR SIGNAL IN RADIO EQUIPMENT

CROSS REFERENCE TO RELATED APPLICATION

This application is a divisional of U.S. application Ser. No. 10/817,410 filed Mar. 30, 2004 now U.S. Pat. No. 7,130,603, which is a continuation of International PCT Application No. PCT/JP01/08729 filed on Oct. 3, 2001, the contents of which are herein incorporated by reference.

FIELD OF THE INVENTION

The present invention relates to radio equipment, and more particularly radio equipment having a local oscillator signal generator, generating local oscillator signals including two types of frequencies, so as to perform communication by switching frequencies of two communication bands in real time. Also, the present invention relates to a method for generating local oscillator signal shaving two types of frequencies in radio equipment.

BACKGROUND OF THE INVENTION

In recent years, mobile communication becomes widely used, and the number of users who use mobile communication terminals such as portable telephone, automobile telephone, Personal Digital Assistant (PDA) is increasing.

For such mobile communication in Japan, a multiplicity of radio bands are in use: UHF 800 MHz band, or shortly, 800M band; quasi-microwave band of 1.5 GHz band, or shortly, 1.5G band; and 1.9 GHz band for use in the PHS (Personal Handy-phone System). Among them, especially in regard to the 800M band for use in portable telephone services, there is an anxiety of line capacity shortage to come, because the number of users are increasing, and the lines are also used for data communication, et cetera.

Therefore, in order to solve the problem of line capacity shortage, there is a demand for a mobile communication terminal enabling continuation of communication by switching even during talking on a phone to another band having room in line capacity at the moment. For example, the demand for the mobile communication terminal is such that the terminal can deal with both the 800M band and the 1.5G band, and that when an applicable channel in the 800M band becomes short during communication, the connection is automatically hopped to use a channel of the 1.5G band, or vice versa. Such a mobile communication terminal is referred to as dual-band mobile communication terminal.

That is, the dual-band mobile communication terminal detects, while using one band, an idle slot in another band in real time, to stimulate the base station to shift to the detected idle slot. Thus a shift to the idle slot is performed, which is referred to as MAHO i.e. the mobile assisted hand-over. In addition, the dual-band mobile communication terminal shifts the slot from one band to another in real time based on the instruction of the base station, irrespective of the terminal in waiting of a call or a packet, or already in a communication state.

Such a demand to the dual-band mobile communication terminal also appears in a mobile communication terminal outside the country, because of, for example, commencement of data communication through GPRS (GSM packet radio service) in overseas countries, in which anxiety of frequency shortage to come also has to be taken into consideration.

Further, in IMT-2000, a wideband CDMA service is to be performed using the 2 GHz band, in which a harmonized service with the existent UHF band service is necessary until the service areas for the wideband CDMA are sufficiently expanded. The dual-band mobile communication terminal is also required from this viewpoint.

In order to actualize such a dual-band mobile communication terminal, it is necessary for the mobile communication terminal to provide two sets of transmitter/receivers that process respective bands. FIG. 6 shows a block diagram illustrating the configuration of a dual-band mobile communication terminal corresponding to 800 MHz band and 1.5 GHz band, which is structured using conventional technique.

To process the two bands i.e. the 800M bands and the 1.5G band, the dual-band mobile communication terminal shown in FIG. 6 is provided with a transmitter/receiver 103, which processes 800M band signals, and a transmitter/receiver 104, which processes 1.5G band signals.

In case that a radio frequency signal (RF reception signal) received by an antenna 101 is an 800M band signal, this RF reception signal is fed to an amplifier 301 provided in transmitter/receiver 103 via an antenna switch 102, and the signal is amplified therein. After the signal amplification, a multiplier (mixer) 303 multiplies the RF reception signal by a local oscillator signal fed from a voltage-controlled oscillator (VCO) 308 to convert the RF reception signal into an intermediate frequency (130 MHz) signal (IF reception signal). Thereafter, the signal is fed to an intermediate frequency section 105.

On the other hand, in case that an RF reception signal is a 1.5G band signal, this RF reception signal is fed to an amplifier 401 of transmitter/receiver 104 via antenna switch 102, and amplified therein. After the signal is amplified, a multiplier (mixer) 403 multiplies the RF reception signal by a local oscillator signal fed from a voltage controlled oscillator (VCO) 408, to convert the RF reception signal to an IF reception signal having the intermediate frequency (130 MHz), and thereafter, the signal is fed to intermediate frequency section 105.

In intermediate frequency section 105, one of the IF reception signal fed from either transmitter/receiver 103 or transmitter/receiver 104 is selected. After the selected IF reception signal is further frequency-converted, the signal is fed to a baseband processor/controller 106.

Meanwhile, a transmission signal fed to intermediate frequency section 105 from baseband processor/controller 106 is converted to either a signal (IF transmission signal) of 260 MHz incase the transmission signal is to be transmitted through an 800M band channel, or an IF transmission signal of 82 MHz in case the transmission signal is to be transmitted through a 1.5G band channel. Thereafter, the signal is fed to either multiplier (mixer) 304 in transmitter/receiver 103 or multiplier (mixer) 404 in transmitter/receiver 104.

In multiplier 304, the IF transmission signal is multiplied by the local oscillator signal fed from VCO 308, and frequency converted into an 800M-band RF transmission signal. In multiplier 404, the IF transmission signal is multiplied by the local oscillator signal fed from VCO 408, and frequency converted into a 1.5G-band RF transmission signal. Each RF transmission signal is amplified by an amplifier 302 or 402, and thereafter transmitted from antenna 101 via antenna switch 102.

Here, switchover control of antenna switch 102 is performed by baseband processor/controller 106.

However, in such a dual-band mobile communication terminal, it is not possible to switch over promptly between the channels of the two bands. In the dual-band mobile communication terminal, channel switchover is required in real time, typically within an allowed limit of approximately 1 millisecond (ms) for the switchover. In contrast, according to the configuration shown in FIG. 6, the switchover time from the 800M band to the 1.5G band is on the order of 4 ms. The reason for this is shown below.

In both the 800M band and the 1.5G band, the RF reception signal and the RF transmission signal have variable frequencies, which vary within a predetermined range (810 MHz-885 MHz in case of the 800M-band RF reception signal, as shown later in FIG. 1) in accordance with the channel allocated at the time of communication.

In order to frequency-convert the RF reception signal of variable frequency into a constant IF reception signal of 130 MHz, or to frequency-convert a constant IF transmission signal of either 260 MHz or 82 MHz to the RF transmission signal of variable frequency, the frequency of the local oscillator signal output from VCO 308 or 408 is controlled to vary in accordance with the RF reception signal frequency or the RF transmission signal frequency.

Now, because it becomes complicated to describe these frequencies using a variable range, a representative value is defined for explanation purpose. Based on this representative value, the switchover time requiring 4 ms is explained in the following.

A representative value of an RF transmission frequency of the 800M band is set to 949 MHz (the center value of the transmission frequency, i.e. the uplink frequency), and a representative value of a reception frequency is set to 819 MHz (the center value of the reception frequency, i.e. the downlink frequency). Further, a representative value of a local oscillator frequency is set to 689 MHz (which is the local oscillator frequency in case of the transmission frequency of 949 MHz and the reception frequency of 819 MHz). Also, a representative value of an RF transmission frequency of the 1.5G band is set to 1,441 MHz (the center value of the uplink frequency), and a representative value of a reception frequency is set to 1,489 MHz (the center value of the downlink frequency). Further, a representative value of a local oscillator frequency is set to 1,359 MHz (which is the local oscillator frequency in case of the transmission frequency of 1,441 MHz and the reception frequency of 1,489 MHz).

The local oscillator signal of the 800M band is generated by a phase lock loop (PLL) structured of a signal loop originating from an integer divider 305, passing through a phase comparator 306, a low pass filter (LPF) 307, and VCO 308, and returning to integer divider 305. Similarly, the local oscillator signal of the 1.5G band is generated by a PLL structured of a signal loop originating from an integer divider 405, passing through a phase comparator 406, an LPF 407, and VCO 408, and returning to integer divider 405.

A comparison frequency input to phase comparators 306 and 406 is set to no greater than 25 kHz, so as to synthesize the local oscillator frequencies at 25 kHz intervals, which are channel intervals in both the 800M band and the 1.5G band. Here, the comparison frequency is set to 25 kHz, as shown in FIG. 6.

In this case, at the local oscillator frequency of 1,359 MHz of the 1.5G band, the frequency division number N of integer divider 405 becomes: N=1,359 MHz/25 kHz=54,360.

The loop gain of the PLL is inversely proportional to the frequency division number N. Therefore, the PLL loop gain becomes smaller in the 1.5G band. This is the reason of the channel switchover time becoming approximately 4 ms.

More specifically, as LPF 307 and LPF 407 in the mobile communication terminal, a filter, referred to as a lag-lead filter, of quadratic delay including fixed resistors R1, R2 and a fixed capacitor C is generally employed, as shown in FIG. 7. This filter circuit is of simple structure enabling a miniaturized LPF, and further a natural angular frequency $\omega_n$ and a dumping factor $\zeta$ can be set independently. These are the reasons for use of such a filter.

According to the LPF shown in FIG. 7, as shown in the calculation result in FIG. 7, natural angular frequency becomes: $\omega_n$=2.266K [rad/s] (360.8 Hz), and the PLL converges with vibrating with a natural vibration period T=1/$F_n$=1/360.8=2.772 ms. Here, $F_n$ is a natural frequency, and is represented by $F_n = \omega_n / 2\pi$.

The transitional response thereof is that the vibration almost converges in approximately three times of the bound (rebound), as shown in FIG. 8, on assumption of the dumping factor $\zeta$=0.6 (where, 0.5-0.7 is considered appropriate). Here, a range to be regarded as converged is that a phase error falls within the range of ±π/10 (a local oscillator frequency error falls within approximately ±1 kHz). The time consumed until the phase error (or frequency error) falls within the range regarded as converged is considered as a convergence time.

Accordingly, when the switchover is performed from the 800M band to the 1.5G band, the time consumed from the response to the convergence is approximately 1.5 times as long as the vibration period T=2.772 ms, that is, approximately 4 ms. In other words, a time approximating 4 ms is necessary from the beginning of the switchover from the 800M band to the 1.5G band until the local oscillator frequency comes to a proper frequency corresponding to the reception channel or the transmission channel. Meanwhile, with regard to the switchover from the 1.5G band to the 800M band, the transition time becomes approximately 2 ms, as a result of calculation similar to the above.

In contrast, there is another way to synthesize a local oscillator signal by use of a fractional divider to achieve a high-speed switchover, as shown in FIG. 9. The configuration shown in FIG. 9 is the same as the configuration shown in FIG. 6, except for integer dividers 305 and 405 shown in FIG. 6 are respectively replaced by fractional dividers 315 and 415 in FIG. 9, and further the comparison frequencies are replaced to 400 kHz and 600 kHz.

Fractional dividers 315, 415 can take a fractional number as the frequency division number (for example, the frequency division number=54,383/24=2,265+23/24=2,265.9583 (circulating decimal)), while the integer divider has an integer frequency division number only.

An advantage of the fractional divider lies in that the intervals of the frequency division number less than an integer value (for example, at intervals of 0.1) is settable. With this, the comparison frequency higher than 25 kHz is settable. This enables a larger PLL loop gain K, and as a result, the convergence time can be shortened. For example, assuming the local oscillator frequency is 1,359.575 MHz, and the frequency division number is 54,383/24=2,265+23/24=2,265.95833 . . . (circular decimal), the comparison frequency becomes 1,359.575 MHz/{2,265+(23/24)}=600 kHz.

This figure corresponds to 24 times as much as the comparison frequency shown in FIG. 6, (24=600 kHz/25 kHz), and the PLL loop gain K multiplied by this multiple number can be obtained. Accordingly, the frequency convergence time becomes approximately 1/24 of that shown in FIG. 6, and as a result, the frequency convergence time=4 ms*(1/24) □ 166.7 microsecond (μs) can be obtained. Thus, it becomes possible to satisfy the requirement for the dual-band mobile communication terminal.

However, when using such a fractional divider, an irregular jitter caused by the fraction adjustment of the frequency division number is produced in the divided signal waveform. This is equivalent to superposed noise, producing noise superposed in the synthesized local oscillator frequency. As a result, there arises a problem of deteriorated spectral purity produced in the local oscillator signal, as shown in FIG. 10.

This deterioration of the signal spectral purity in the local oscillator frequency produces another problem in the mobile communication terminal: a problem of difficulty in conforming to the standards of adjacent channel leakage power in the transmission characteristics of the mobile communication terminal, and also, to the standard of adjacent channel selectivity and next adjacent channel selectivity in the reception characteristics, as well as the anti-interference capability represented by intermodulation response rejection.

Further, the fractional divider and the phase comparator is desirably structured of a single monolithic integrated circuit, so as to achieve a miniaturized and lightweight mobile communication terminal. However, cost for structuring the fractional divider into the integrated circuit is high. Namely, a large circuit scale makes it difficult to produce an integrated circuit including a frequency divider operational at a frequency over 1 GHz, in which an arbitrary fractional frequency division number is settable. Additionally, technique of introducing an addition circuit has been proposed, so as to overcome the above-mentioned problem related to the fraction processing against the fractional frequency division number. However, because of this addition circuit, the circuit scale becomes larger. Manufacturing a monolithic LSI for the PLL also brings about higher cost, which retrogrades against technological trend to manufacture a low-cost mobile communication terminal.

SUMMARY OF THE INVENTION

The present invention has been achieved in consideration of the aforementioned background. It is an object of the present invention is to provide radio equipment having a local oscillator signal generator enabling high-speed switch over between two communication bands, and to provide a method for generating two types of local oscillator signals for the radio equipment.

Further, it is another object of the invention to provide radio equipment having a local oscillator signal generator enabling no deterioration of frequency spectral purity, and a local oscillator signal generation method for the radio equipment.

Also, it is still another object of the present invention to provide radio equipment having a local oscillator signal generator easy for structuring in an integrated circuit for the purpose of miniaturization with reduced weight.

According to a first aspect of the present invention, in radio equipment enabling radio communication by performing frequency conversion corresponding to signals of different frequency bands, the radio equipment includes a local oscillator signal generator which further includes: a first signal generator generating a first signal having a first frequency; a second signal generator having a second frequency divider to which a feedback signal is input, a second phase comparator comparing the output signal phase of the second frequency divider with the phase of a second reference input signal having a predetermined frequency, a second filter filtering an output signal of the second phase comparator, and a second voltage controlled oscillator which generates a second signal having a second frequency lower than the first frequency based on the output signal of the second filter, and feedbacks the second signal to the second frequency divider as the feedback signal; and a frequency synthesizer synthesizing the first signal with the second signal, generating a local oscillator signal either having a frequency derived from adding the second frequency to the first frequency, or having a frequency derived from subtracting the second frequency from the first frequency. The radio equipment uses the local oscillator signal generated by the frequency synthesizer for frequency conversion in the radio communication.

According to the first aspect of the present invention, in a local oscillator signal generation method for generating a local oscillator signal for use in frequency conversion in radio equipment enabling radio communication by performing frequency conversion corresponding to signals on different frequency bands, the local oscillator signal generation method includes: generating a first signal having a first frequency; generating a second signal having a second frequency lower than the first frequency, by use of a phase lock loop which includes a voltage controlled oscillator, a frequency divider to which a feedback signal is input from the voltage controlled oscillator, a phase comparator comparing a phase of output signal of the frequency divider with a phase of a reference input signal having a predetermined frequency, and a filter filtering output signal of the phase comparator and feeding the output signal to the voltage controlled oscillator; and synthesizing the first signal with the second signal, and generating the local oscillator signal either having a frequency derived from adding the second frequency to the first frequency, or having a frequency derived from subtracting the second frequency from the first frequency.

According to the first aspect of the invention, the first signal having the first frequency is generated in the first signal generator, and the second signal having the second frequency smaller than the first frequency is generated in the second signal generator. These first and second signals are synthesized, and the local oscillator signal either having the frequency derived from adding the second frequency to the first frequency, or having the frequency derived from subtracting the second frequency from the first frequency is generated.

According to the first aspect of the invention, it is possible to generate two type of local oscillator signals: the local oscillator signal having the frequency derived from adding the second frequency to the first frequency; and the local oscillator signal having the frequency derived from subtracting the second frequency from the first frequency. With this, the local oscillator signal is generated for use in converting each frequency of the two bands in radio equipment (exemplarily, dual-band mobile communication terminal), which performs communication by switching frequencies in the two communication bands, to another frequency (exemplarily, intermediate frequency).

Also, the frequency of the second signal smaller than the frequency of the local oscillator signal generated by the addition can be obtained. With this, it becomes possible to set the frequency division number of the second frequency divider smaller than the frequency division number being set when the local oscillator signal is directly generated by the second signal generator. As a result, it becomes possible to obtain a smaller convergence time of the second signal generator than the convergence time in the conventional method. Accordingly, when this local oscillator signal generator is employed in a dual-band mobile communication terminal, a high-speed switchover between the two communication bands can be obtained.

Preferably, the first frequency of the first signal generated by the first signal generator is a constant frequency, the second frequency divider in the second signal generator can set a variable frequency division number, and the second frequency of the second signal generated by the second signal generator is variable corresponding to the frequency division number. With this, the control becomes easy even in case of varying the frequency of the local oscillator signal.

Further, preferably, the second frequency divider is an integer divider having a positive integer value of a frequency division number. With this, it becomes easy to integrate a unit including the second frequency divider, and miniaturization of the unit can be actualized. Also, degradation of the spectral purity that occurs when using a fractional divider can be prevented.

According to one embodiment of the first aspect of the present invention, the frequency synthesizer includes: a first phase shifter shifting the phase of the first signal, and generating a third signal having a phase relatively advanced by $\pi/2$ and a fourth signal having a phase relatively delayed by $\pi/2$; a second phase shifter shifting the phase of the second signal, and generating a fifth signal having a phase relatively advanced by $\pi/2$ and a sixth signal having a phase relatively delayed by $\pi/2$; an inverter/non-inverter inverting the positive or negative sign of the fifth signal when generating the local oscillator signal having a frequency derived from adding the second frequency to the first frequency, or not inverting the positive or negative sign of the fifth signal when generating the local oscillator signal having a frequency derived from subtracting the second frequency from the first frequency; a first multiplier multiplying the third signal by the fifth signal passed through the inverter/non-inverter; a second multiplier multiplying the fourth signal by the sixth signal; and an adder adding output signal of the first multiplier and output signal of the second multiplier. With this, a miniaturized and low-cost frequency synthesizer with low power consumption can be attained.

According to a second aspect of the present invention, in radio equipment enabling radio communication by performing frequency conversion corresponding to signals of different frequency bands, the radio equipment includes a local oscillator signal generator which further includes: a first signal generator having a first frequency divider to which a feedback signal is input, a first phase comparator comparing a phase of output signal of the first frequency divider with a phase of a first reference input signal having a predetermined frequency, a first filter filtering output signal of the first phase comparator, and a first voltage controlled oscillator which generates a first signal having a first frequency based on output signal of the first filter, and feedbacks the first signal to the first frequency divider as the feedback signal; a second signal generator having a second frequency divider to which a feedback signal is input, a second phase comparator comparing a phase of output signal of the second frequency divider with the phase of a second reference input signal having a predetermined frequency, a second filter filtering output signal of the second phase comparator, and a second voltage controlled oscillator which generates a second signal having a second frequency different from the first frequency based on output signal of the second filter, and feedbacks the second signal to the second frequency divider as the feedback signal; and a frequency synthesizer synthesizing the first signal with the second signal, and generating a local oscillator signal either having a frequency derived from adding the first frequency to the second frequency, or having a frequency derived from subtracting the smaller frequency between the first frequency and the second frequency, from the larger frequency therebetween. The radio equipment uses the local oscillator signal generated by the frequency synthesizer for frequency conversion in the radio communication.

In a local oscillator signal generation method, according to the second aspect of the present invention, for generating a local oscillator signal for use in frequency conversion in radio equipment enabling radio communication by performing frequency conversion corresponding to signals of different frequency bands, the local oscillator signal generation method includes: generating a first signal having a first frequency by use of a phase lock loop which includes a first voltage controlled oscillator, a first frequency divider to which a feedback signal is input from the first voltage controlled oscillator, a first phase comparator comparing a phase of output signal of the first frequency divider with a phase of a first reference input signal having a predetermined frequency, and a filter filtering output signal of the first phase comparator and feeding the output signal to the first voltage controlled oscillator; generating a second signal having a second frequency different from the first frequency, by use of a phase lock loop which includes a second voltage controlled oscillator, a second frequency divider to which a feedback signal is input from the second voltage controlled oscillator, a second phase comparator comparing a phase of output signal of the second frequency divider with a phase of a second reference input signal having a predetermined frequency, and a filter filtering output signal of the second phase comparator and feeding the output signal to the second voltage controlled oscillator; and synthesizing the first signal with the second signal, and generating the local oscillator signal either having a frequency derived from adding the second frequency to the first frequency, or having a frequency derived from subtracting the smaller frequency between the first frequency and the second frequency, from the larger frequency therebetween.

According to the second aspect of the invention, it is possible to generate two type of local oscillator signals: a local oscillator signal having the frequency derived from adding the second frequency to the first frequency; and a local oscillator signal having the frequency derived from subtracting the smaller frequency between the first frequency and the second frequency, from the larger frequency therebetween. With this, the local oscillator signal is generated for use in converting each frequency of the two bands in radio equipment (exemplarily, dual-band mobile communication terminal), which performs communication by switching frequencies in the two communication bands, to another frequency (exemplarily, intermediate frequency).

Also, the frequency of the first signal smaller than the frequency of the local oscillator signal generated by the addition can be obtained. With this, it becomes possible to set each frequency division number of the first frequency divider smaller than the frequency division number being set when the local oscillator signal is directly generated by the first signal generator. As a result, it becomes possible to obtain a shorter convergence time of the first signal generator than the convergence time in the conventional method. Accordingly, when this local oscillator signal generator is employed in a dual-band mobile communication terminal, a high-speed switchover between the two communication bands can be obtained. The above description is also applicable to the second signal.

According to a third aspect of the present invention, in a radio equipment generating a signal of a first frequency band by frequency-converting using a signal of a third frequency band, and generating a signal of a second frequency band by frequency-converting using a signal of a fourth frequency band, thereby enabling transmitting whichever signals of the first frequency band and the second frequency band to other radio equipment, the radio equipment includes: a first output section outputting a signal of a predetermined frequency belonging to a band lying between the third frequency band and the fourth frequency band; a second output section outputting a signal of a predetermined frequency; and a generation and output section generating and outputting, using the signals from the first output section and the second output section, a signal having a frequency equal to the frequency sum of the signals from the first and second output sections, or a signal having a frequency equal to the frequency difference between the signals from the first and the second output section, respectively as the signal of the third frequency band and the signal of the fourth frequency band.

According to a fourth aspect of the present invention, in a radio equipment converting a signal frequency of a first frequency band using a signal of a third frequency band, and converting a signal frequency of a second frequency band using a signal of a fourth frequency band, thereby enabling reception of whichever signals of the first frequency band and the second frequency band transmitted from other radio equipment, the radio equipment includes: a first output section outputting a signal of a predetermined frequency belonging to a band lying between the third frequency band and the fourth frequency band; a second output section outputting a signal of a predetermined frequency; and a generation and output section generating and outputting, using the signals from the first output section and the second output section, a signal having a frequency equal to the frequency sum of the signals from the first and second output sections, or a signal having a frequency equal to the frequency difference between the signals from the first and the second output section, respectively as the signal of the third frequency band and the signal of the fourth frequency band.

BRIEF DESCRIPTION OF THE DRAWINGS

FIG. 7 shows a circuit diagram illustrating an exemplary configuration of a low pass filter.

DETAILED DESCRIPTION OF THE PREFERRED EMBODIMENTS

The preferred embodiment of the present invention is described hereinafter referring to the charts and drawings. It is noted that the following description shows merely an example of the embodiments, and the scope of the invention is not limited to the embodiments described below.

The following embodiment describes a dual-band mobile communication terminal capable of communication on both the 800M band and the 1.5G band in the exemplary mobile communication environment in Japan.

Before starting concrete explanation of the dual-band mobile communication terminal, the communication bands of the 800M band and the 1.5G band used in Japan will be explained briefly, for the sake of easy understanding of this dual-band mobile communication terminal.

Figure 1:
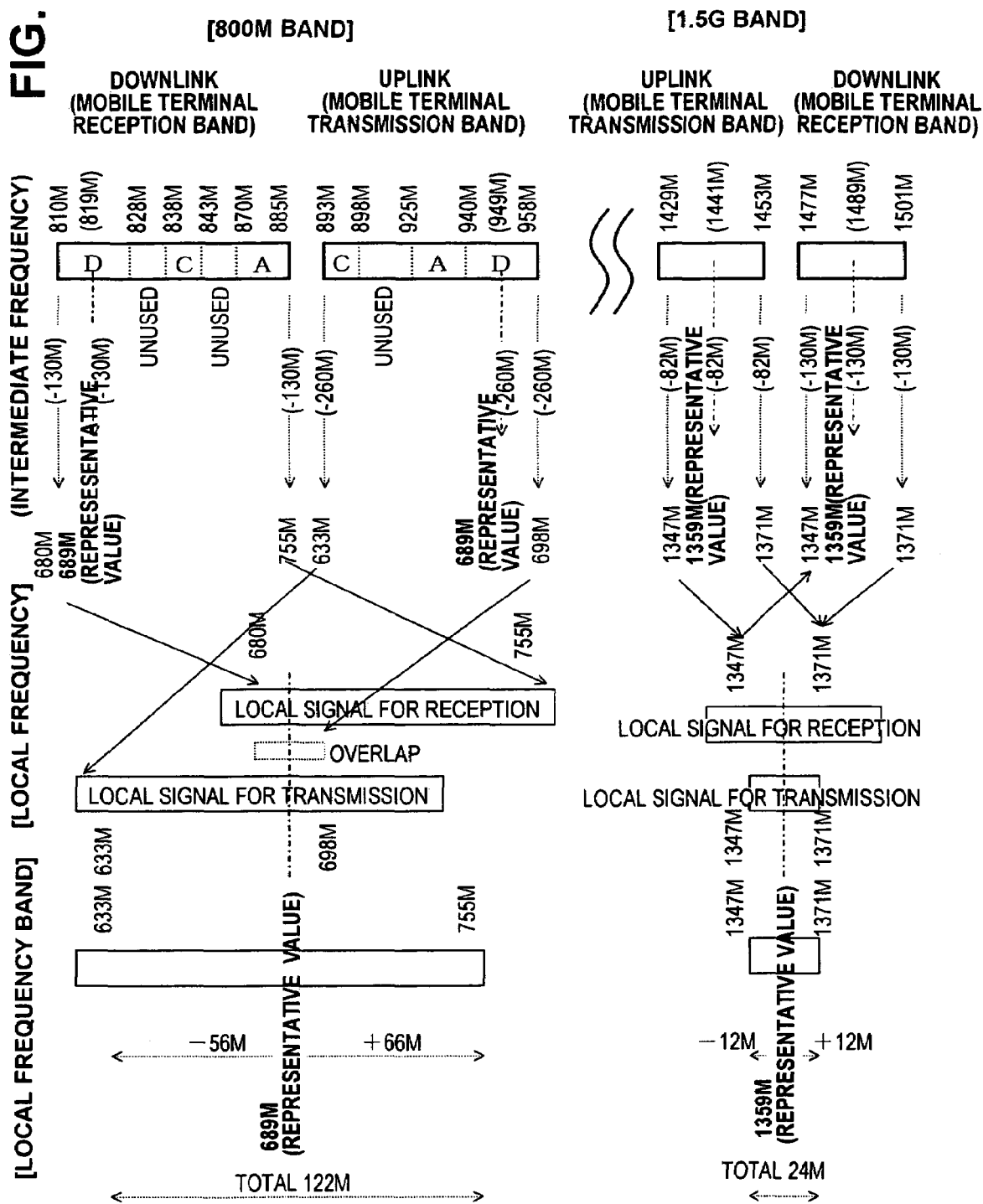
FIG. 1 shows an explanation diagram of the frequency bands for use in the 800M band and the 1.5G band in Japan.

FIG. 1 shows an explanation diagram of the frequency bands for use in the 800M band and the 1.5G band in Japan.

In the 800M band, bands from 810 MHz to 885 MHz are used as the downlink communication bands from the base station to the mobile communication terminal (i.e. the mobile communication terminal reception bands). Also, bands from 893 MHz to 958 MHz are used for the uplink communication bands from the mobile communication terminal to the base station (i.e. the mobile communication terminal transmission bands). Both the downlink communication bands and the uplink communication bands are divided into bands commonly known as A-band (former analog band), C-band and D-band (digital bands), which are known to those having general knowledge (and skilled in the art) in the field of the invention. Therefore, the detailed description is omitted here.

In the 1.5G band, bands from 1,477 MHz to 1,501 MHz are used as the downlink communication bands, and bands from 1,429 MHz to 1,453 MHz are used as the uplink communication bands.

At the time of communication, a reception channel is set up using one frequency band (among the frequency bands allocated at 25 kHz intervals) of the downlink communication bands, while a transmission channel is set up using one frequency (among the frequency bands allocated at 25 kHz intervals) of the uplink communication bands.

Further, in the 800M band, local oscillator frequencies of the local oscillator signals (local signals for transmission) for use in converting the IF (intermediate frequency) transmission signals to the RF (radio frequency) transmission signals are allocated in the bands from 633 MHz to 698 MHz, while local oscillator frequencies of the local oscillator signals (local signals for reception) for use in converting the RF (radio frequency) transmission signals to the IF (intermediate frequency) transmission signals are allocated in the bands from 680 MHz to 755 MHz. Meanwhile, in the 1.5G band, local oscillator frequencies of the local oscillator signals (local signals for transmission) coincide with local oscillator frequencies of the local oscillator signals (local signals for reception), which are allocated in the bands from 1,347 MHz to 1,371 MHz.

Figure 2:
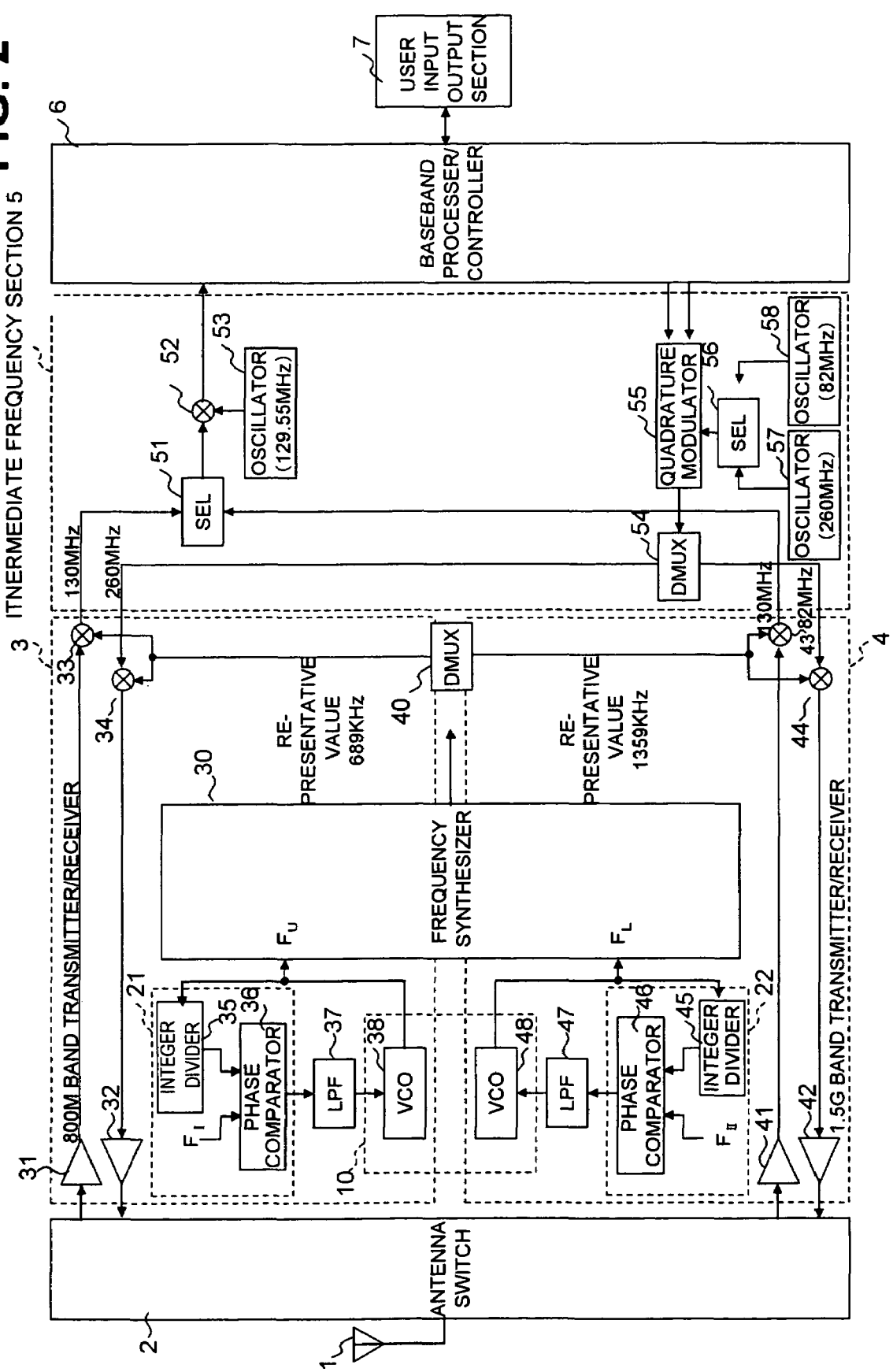
FIG. 2 shows a block diagram of a configuration of a mobile communication terminal according to an embodiment of the present invention.

Now, hereafter, the configuration of the dual-band mobile communication terminal according to the embodiment of the present invention is described in the following. FIG. 2 shows a block diagram of a configuration of the dual-band mobile communication terminal according to the embodiment of the present invention. This dual-band mobile communication terminal (hereafter simply referred to as terminal) is capable of communicating, for example, on both the 800M band and the 1.5G band.

The terminal is provided with antenna 1, antenna switch 2, transmitter/receiver 3 for the 800M band, transmitter/receiver 4 for the 1.5G band, intermediate frequency section 5, baseband processor/controller 6 and user input/output section 7.

Transmitter/receiver 3 for the 800M band includes amplifiers 31 and 32, multipliers (mixers) 33 and 34, integer divider 35, phase comparator 36, low pass filter (hereafter referred to as LPF) 37, and voltage controlled oscillator (hereafter referred to as VCO) 38. Also, transmitter/receiver 4 for the 1.5G band includes amplifiers 41 and 42, multipliers (mixers) 43 and 44, integer divider 45, phase comparator 46, LPF 47, and VCO 48. Further, transmitter/receivers 3 and 4 is commonly provided with a frequency synthesizer 30 and a demultiplexer (DMUX) 40.

Here, VCOs 38, 48 preferably includes a single integrated circuit 10, to enable miniaturization and weight reduction of the terminal.

Intermediate frequency section 5 is provided with selectors (hereafter referred to as SEL) 51 and 56, a multiplier (mixer) 52, an oscillator 53 for generating a 129.55 MHz local oscillator signal, a demultiplexer (DMUX) 54, a quadrature modulator 55, an oscillator 57 for generating a 260-MHz local oscillator signal, and an oscillator 58 for generating an 82-MHz local oscillator signal.

Antenna 1 transmits and receives radio signals on the 800M band and the 1.5G band, which includes, for example, a whip antenna and a diversity antenna.

Antenna switch 2 feeds a radio signal of the 800M band to transmitter/receiver 3, or a radio signal of the 1.5G band to transmitter/receiver 4, respectively being input from antenna 1, and also selects a signal input from transmitter/receiver 3 or 4 and transmits the signal via antenna 1. Such a switch over of antenna switch 2 is performed under the control of baseband processor/controller 6.

Transmitter/receiver 3 converts a reception signal of radio frequency (hereafter referred to as RF reception signal) on the 800M band being input from antenna switch 2 to a reception signal of intermediate frequency (130 MHz fixed, hereafter referred to as IF reception signal), and feed this IF reception signal to intermediate frequency section 5. Also, transmitter/receiver 3 converts a transmission signal of intermediate frequency (260 MHz constant, hereafter referred to as IF transmission signal) fed from intermediate frequency section 5 to a transmission signal of radio frequency (hereafter referred to as RF transmission signal) on the 800M band, and feeds this RF transmission signal to antenna switch 2.

Similarly, transmitter/receiver 4 converts a 1.5G-band RF reception signal to an IF reception signal (130 MHz, fixed), and an IF transmission signal (82 MHz, constant) to a 1.5G-band RF transmission signal, and feeds this RF transmission signal to antenna switch 2.

The IF reception signal and the IF transmission signal have constant frequencies. In contrast, the RF reception signal and the RF transmission signal have frequencies that vary depending on the channel being set up in the bands in FIG. 1 illustrated before.

In intermediate frequency section 5, one of the 800M-band IF reception signal and the 1.5G band IF reception signal is selected by SEL 51, and fed to multiplier 52. To multiplier 52, a signal having a local oscillator frequency of 129.55 MHz is fed by oscillator 53. With this, the IF reception signal is converted into a signal having a frequency of 450 kHz (constant). The converted signal is then fed to baseband processor/controller 6. Selection control in SEL 51 is performed by baseband processor/controller 6. (The control line is not shown in the figure.)

Meanwhile, to intermediate frequency section 5, the transmission signal is input from baseband processor/controller 6 in the form of an in-phase signal (I signal) and a quadrature signal (Q signal). These transmission signals are fed to quadrature modulator 55 in intermediate frequency section 5.

From SEL 56 to quadrature modulator 55, the local oscillator signal (or local signal) of 260 MHz (constant) fed from oscillator 57, or the local oscillator signal of 82 MHz (constant) fed from oscillator 58 is input. SEL 56 selects the local oscillator signal fed from oscillator 57 when quadrature modulator 55 processes the 800M-band transmission signal, or selects the local oscillator signal fed from oscillator 58 when quadrature modulator 55 processes the 1.5G-band transmission signal. Such selection by SEL 56 is performed under the control of baseband processor/controller 6 (the control line not shown in the figure.)

Quadrature modulator 55 performs quadrature modulation of the I signal and the Q signal input from baseband processor/controller 6, and converts the quadrature modulation signal into the IF transmission signal having a frequency of 260 MHz or 82 MHz by use of the local oscillator signal input from SEL 56. This IF transmission signal is fed to DMUX 54. The 800M-band IF transmission signal is then fed to multiplier 34, while the 1.5G-band IF transmission signal is fed to multiplier 44. Such output path selection by DMUX 54 is performed under the control of baseband processor/controller 6 (the control line not shown in the figure).

Baseband processor/controller 6 processes the signal input from intermediate frequency section 5, and outputs the processed signal to user input/output section 7. At the same time, baseband processor/controller 6 processes the signal (voice signal, video signal, or the like) being input from a user via user input/output section 7, and feeds the processed signal to intermediate frequency section 5. Further, baseband processor/controller 6 controls SELs 51, 56, DMUXs 54, 40, as described earlier, as well as frequency synthesizer 30 (described in detail later), etc.

User input/output section 7 is provided with speaker, microphone, display unit (liquid crystal display, or the like), camera, etc. User input/output section 7 outputs the signal fed from baseband processor/controller 6 to the speaker, the display unit, etc., and feeds the signal input from the microphone, the camera, etc. to baseband processor/controller 6.

In transmitter/receiver 3, a signal loop, which originates from integer divider 35, passes through phase comparator 36, LPF 37, and VCO 38, and returns to integer divider 35, forms a phase lock loop (hereafter referred to as PLL).

In integer divider 35, a fixed value of the frequency division number N1 (integer value) is set. This frequency division number N1 may be stored in advance in integer divider 35, or may be set by base band processor/controller 6 at the time of initiating the terminal.

To phase comparator 36, an output signal from integer divider 35 and a signal having a constant frequency $F_I$ fed from a non-illustrated oscillator (for example, crystal oscillator) are input. The signal from the oscillator may be fed from the oscillator via a non-illustrated frequency divider. With this, from VCO 38, a signal having a constant frequency $F_U$ (hereafter referred to as a first frequency) is fed to both frequency synthesizer 30 and integer divider 35.

Similarly in transmitter/receiver 4, a signal loop, which originates from integer divider 45, passes through phase comparator 46, LPF 47, and VCO 48, and returns to integer divider 45, forms a PLL.

In integer divider 45, a variable frequency division number N2 (integer value), corresponding to each frequency of either the RF reception signal or the RF transmission signal on the 800M band is set, or, a variable frequency division number N2 corresponding to each frequency of the RF reception signal or the RF transmission signal on the 1.5G band is set. (The control lines for setting are not shown in the figure.)

To phase comparator 46, both an output signal from integer divider 45 and a signal having a constant frequency $F_{II}$ fed from a non-illustrated oscillator (for example, crystal oscillator) are input. Or this signal fed from the oscillator may be fed from the oscillator via a non-illustrated frequency divider. With this, a signal having a frequency $F_L$ (hereafter referred to as a second frequency) corresponding to each frequency (which is variable at frequency intervals $F_{II}$) of the RF reception signal or the RF transmission signal is fed from VCO 48 to both frequency synthesizer 30 and integer divider 45.

Here, the frequencies of the RF reception signal and the RF transmission signal vary (at intervals of 25 kHz), depending on the channel assigned at the time of communication, in the bandwidths shown in FIG. 1. For the sake of easy understanding, in place of these frequencies, representative frequency values are used in the following description.

Similar to the foregoing description on the background art, a frequency of 689 MHz is used as representative value of the local oscillator frequency on the 800M band. This representative frequency value corresponds to the local oscillator frequency for the transmission frequency of 949 MHz and the reception frequency of 819 MHz. Also, as representative value of the local oscillator frequency on the 1.5G band, a frequency of 1,359 MHz is used. This representative frequency value corresponds to the local oscillator frequency for the transmission frequency of 1,441 MHz and the reception frequency of 1,489 MHz.

The difference between these local oscillator frequencies equals to 670 MHz (=1,359 MHz−689 MHz). Namely, the two frequencies have sufficient spaces between each other. Therefore, even under variable conditions, these local oscillator frequencies do not overlap nor approach. Accordingly, the median of these frequencies is obtained, and defined as a first frequency $F_U$ to be fed from VCO 38 to the frequency synthesizer.

The first frequency $F_U$=(689+1,359)/2=1,024 [MHz] (constant value) (1)

Here, this value shows merely an example, and it is not necessary to use the exact median. Any other frequency between the two local oscillator frequencies may be used.

In order to set $F_U$=1,024 MHz, for example, the frequency division number N1=1,024, and $F_I$=1,000 kHz are set. The combination of the frequency division number N1 and the frequency $F_I$ also is an example. It may also be possible to use any other combination with which VCO 38 can generate the first frequency $F_U$.

Meanwhile, the second frequency $F_L$ is set to a value (variable) capable of generating a frequency of the 800M-band local oscillator signal (representative value of 689 MHz) and a frequency of the 1.5G-band local oscillator signal (representative value of 1,359 MHz), by synthesizing with the first frequency $F_U$ in frequency synthesizer 30.

As an example of frequency synthesis performed in frequency synthesizer 30, addition or subtraction of the frequencies can be used. Namely, frequency synthesizer 30 generates a signal having the 1.5G-band local oscillator frequency of 1,359 MHz (representative value), which is derived from adding a signal having the second frequency $F_L$ to a signal having the first frequency $F_U$. Also, frequency synthesizer 30 generates a signal having the 800M-band local oscillator frequency of 689 MHz (representative value), which is derived from subtracting a signal having the second frequency $F_L$ from the signal having the first frequency $F_U$.

In such a case, the second frequency $F_L$ (representative value) is set as follows:

$F_L$=|1024−689|=|1024−1359|=335 [MHz] (representative value) (2)

This second frequency $F_L$ is a relatively low frequency located in the lower limit of the UHF band.

Because the transmission/reception channel are allocated at 25 KHz intervals, the signal fed to phase comparator 46 having a constant frequency $F_{II}$ is set to 25 KHz, so that the local oscillator frequency signals (reference input signals) at 25 kHz intervals are synthesized. Meanwhile, the frequency division number N2 of integer divider 45 is set to N2=13,400 (representative value), so that the second frequency $F_L$=335 MHz (representative value) can be generated. By incrementing or decrementing this frequency division number N2, local oscillator frequencies are generated at 25 kHz intervals for adjacent channels.

Figure 3:
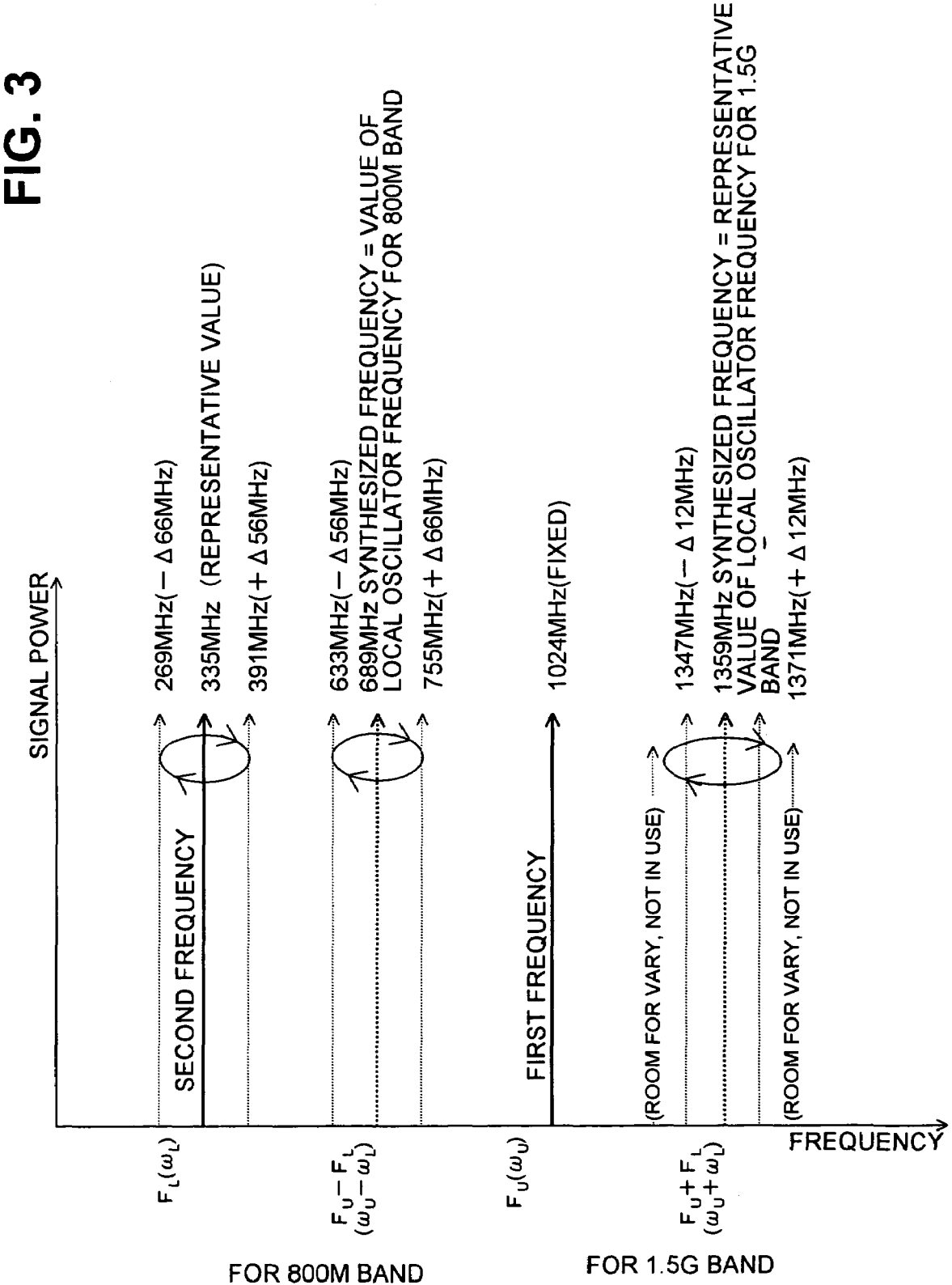
FIG. 3 shows relations of a first frequency $F_H$, a second frequency $F_L$, and a local oscillator frequency synthesized from the first frequency $F_H$ and the second frequency $F_L$.

FIG. 3 shows relations among the first frequency $F_U$, the second frequency $F_L$, and the local oscillator frequencies synthesized by the first frequency $F_U$ and the second frequency $F_L$. In consideration of the variation width of the 800M-band local oscillator frequencies and the variation width of the 1.5G-band local oscillator frequencies, the second frequency $F_L$ is set between 269 MHz and 391 MHz. In other words, the frequency division number N2 is set variably between 10,760 (=269 MHz/25 kHz) and 15,640 (=391 MHz/25 kHz). Additionally, as shown in FIG. 3, the variation of the frequency division number N2 on the 1.5G band ranges from 12,920 to 13,880, because the local oscillator frequency range of the 1.5G band is narrower than that of the 800M band.

The above-mentioned frequency division number of such integer divider 45 becomes on the order of one fourth of the conventional frequency division number. As a result, the convergence time of the second frequency $F_{II}$ becomes approximately one fourth of the conventional convergence time of approximately 4 ms, that is, on the order of 1 ms (1/1000 sec).

This second frequency $F_L$ is used for generating both the local oscillator frequency of the 800M band and the local oscillator frequency of the 1.5G band. Accordingly, the convergence time of both the 800M-band local oscillator frequency and the 1.5G-band local oscillator frequency become on the order of one fourth of 4 ms, i.e. approximately 1 ms. In contrast, it is not necessary to consider the convergence time of the first frequency $F_U$, because the first frequency $F_U$ is fixed (namely, in a convergence state at any time).

As a result, the switchover time from the 800M band to the 1.5G band, and also from the 1.5G band to the 800M band, can be shortened, resulting in the switchover time of approximately 1 ms or less in both cases. Thus, the requirement for the terminal to switch over in real time can be satisfied.

Further, according to the embodiment, it becomes easier to configure the portions shown below, with monolithic integrated circuits (PLL integrated circuits), respectively: the portion illustrated using a symbol 21 shown in FIG. 2, which includes integer divider 35, phase comparator 36, and generator circuit generating frequency $F_I$, for example, a crystal oscillator (or a crystal oscillator and an integer divider); and also the portion illustrated using a symbol 22, which includes integer divider 45, phase comparator 46, and generator circuit generating frequency $F_{II}$, for example, a crystal oscillator (or a crystal oscillator and an integer divider). As a result, the terminal can be configured of a miniaturized and light structure having low power consumption.

Further, by use of integer divider 35, it becomes possible to prevent the spectral purity of the local oscillator frequency signals from deterioration. Also it becomes easier to conform to the standards of adjacent channel leakage power in the transmission characteristics, and also in the reception characteristics, adjacent channel selectivity and next adjacent channel selectivity, as well as the anti-interference capability represented by intermodulation response rejection.

Next, a detailed configuration of frequency synthesizer 30 will be described hereafter. Frequency synthesizer 30 generates frequencies (representative value of 689 MHz) of the 800M-band local oscillator signal by subtracting the second frequency $F_L$ from the first frequency $F_U$. Frequency synthesizer 30 also generates frequencies (representative value of 1,359 MHz) of the 1.5G-band local oscillator signal by adding the second frequency $F_L$ to the first frequency $F_U$.

As such, these local oscillator frequencies are generated by indirectly synthesizing from the two frequencies through the arithmetic operations of the signals. Here, 'indirectly' signifies that the local oscillator frequency sources are not used as direct frequency sources.

In general, a frequency sum or a frequency difference of two frequencies can be derived from multiplying the two frequencies in a multiplier. By multiplying the two frequencies in the multiplier, carrier signal of the two frequency sources is suppressed, and the energy thereof is equally divided to a lower sideband produced from the frequency difference, and to an upper sideband produced from the frequency sum. By the use of a filter, an unused frequency on one side is attenuated, and only the other frequency for use is obtained through the filter.

However, for this purpose, use of a dielectric of TEM mode, separate circuit elements such as coils and capacitors, and a laminated ceramic LC filter retrogrades against technical trends toward miniaturization and cost reduction of the terminal. Further, because the energy is equally divided to both sidebands, as described above, required energy in one sideband is in principle a half of the original energy. In other words, the other half of the original energy is wasted in the other sideband not for use. The use of the filter unworthily eliminating the unused energy on the other sideband retrogrades a technical trend toward lower power consumption.

Figure 4:
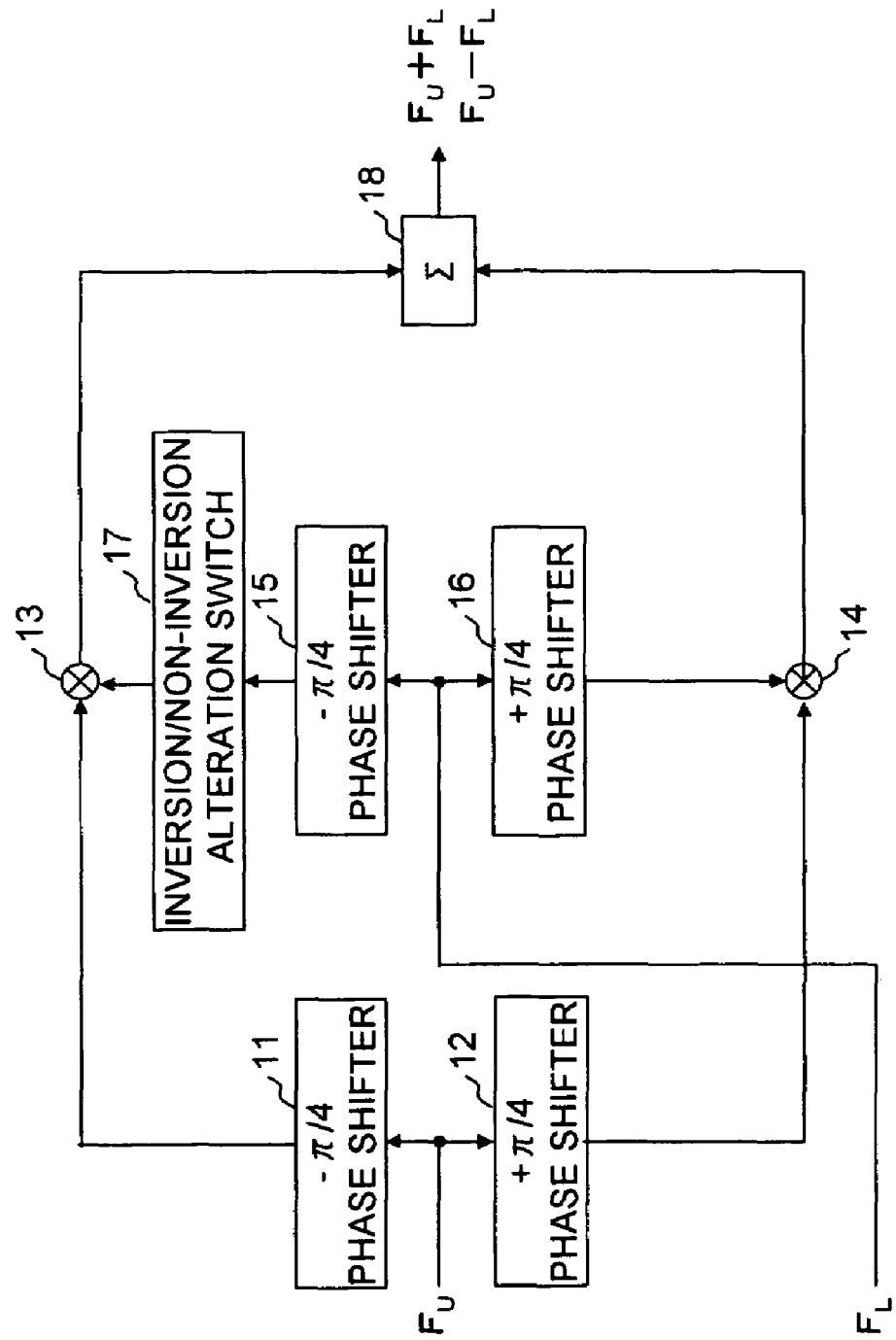
FIG. 4 shows a block diagram illustrating an exemplary configuration of a frequency synthesizer according to an embodiment of the present invention.

From this viewpoint, in the embodiment of the present invention, a frequency synthesis method, different from the conventional method, is introduced. FIG. 4 shows a block diagram illustrating a detailed configuration of frequency synthesizer 30 according to the embodiment of the present invention.

Frequency synthesizer 30 is provided with $-\pi/4$ phase shifters 11 and 15, $+\pi/4$ phase shifters 12 and 16, multipliers 13 and 14, an inversion/non-inversion alteration switch 17, and an adder 18.

The local oscillator signal S1 having the first frequency $F_U$ output from VCO 38 (refer to FIG. 2) is input to $-\pi/4$ phase shifter 11 and $+\pi/4$ phase shifter 12. Also, the local oscillator signal S2 having the second frequency $F_L$ output from VCO 48 (refer to FIG. 2) is input to $-\pi/4$ phase shifter 15 and $+\pi/4$ phase shifter 16.

For easy understanding of calculation, assuming that the local oscillator signal S1=cos ($\omega_U t$) (where, $\omega_U = 2\pi F_U$), a signal S11 output from phase shifter 11 becomes S11=cos ($\omega_U t - \pi/4$), and a signal S12 output from phase shifter 12 becomes S12=cos ($\omega_U t + \pi/4$). Also, assuming the local oscillator signal S2=cos ($\omega_L t$) ($\omega_L = 2\pi F_L$), then a signal S15 output from phase shifter 15 becomes S15=cos ($\omega_L t - \pi/4$), and a signal S16 output from phase shifter 16 becomes S16=cos ($\omega_L t + \pi/4$).

With regard to inversion/non-inversion alteration switch 17, to obtain the frequency difference, the sign of the signal output from the $-\pi/4$ phase shifter 15 is not inverted (that is, the input signal is output without alteration) based on a control signal fed from baseband processor/controller 6 (control signal line not shown in the figure). On the other hand, to obtain the frequency sum, the sign of the signal is inverted (that is, the voltage value of the input signal is inverted and output.)

Because the signal is not inverted when the frequency difference ($F_L - F_U$) is to obtain, in this case, multiplier 13 multiplies the signal S11 output from the phase shifter 11, namely S11=cos ($\omega_U t - \pi/4$), by the signal S16 output from the phase shifter 16, namely S15=cos ($\omega_L t - \pi/4$) and outputs a product A1.

$$A1 = (1/2) * \{\cos(\omega_U t + \omega_L t - \pi/2) + \cos(\omega_U t - \omega_L t)\} \quad (3)$$
$$= (1/2) * \{\sin(\omega_U t + \omega_L t) + \cos(\omega_U t - \omega_L t)\}$$

Meanwhile, multiplier 14 multiplies the signal S12 output from the phase shifter 12 by the signal S15 output from the phase shifter 15, and outputs a product A2.

$$A2 = (1/2) * \{\cos(\omega_U t + \omega_L t + \pi/2) + \cos(\omega_U t - \omega_L t)\} \quad (4)$$
$$= (1/2) * \{-\sin(\omega_U t + \omega_L t) + \cos(\omega_U t - \omega_L t)\}$$

Adder 18 adds the product A1 and the product A2, and outputs a sum R.

$$R = A1 + A2 = \cos(\omega_U - \omega_L)t = \cos 2\pi(F_U - F_L)t \quad (5)$$

Thus, the frequency of this sum R, which is equal to a difference of the first frequency $F_U$ from the second frequency $F_L$, is obtained.

On the other hand, to obtain the frequency sum ($F_L + F_U$), the signal S15 output from phase shifter 15 is inverted. Multiplier 13 multiplies the signal S11 output from phase shifter 11, namely S11=cos ($\omega_U t - \pi/4$), by the inverted output signal S15 from phase shifter 15, namely $-S15=-\cos(\omega_L t - \pi/4)$, and outputs a product A3.

$$A3 = -(1/2) * \{\cos(\omega_U t + \omega_L t - \pi/2) + \cos(\omega_U t - \omega_L t)\} \quad (6)$$
$$= -(1/2) * \{\sin(\omega_U t + \omega_L t) + \cos(\omega_U t - \omega_L t)\}$$

Meanwhile, the multiplied result of multiplier 14 is the same as the above-mentioned multiplied result A2. Therefore, the sum R output from adder 18 is, $$R = A3 + A2 = -\sin(\omega_U + \omega_L)t = -\sin 2\pi(F_U + F_L)t \quad (7)$$

Thus, a frequency sum of the first frequency $F_U$ and the second frequency $F_L$ is obtained.

Such frequency synthesizer 30 can be actualized as an integrated circuit of small scale. Frequency synthesizer 30 can be formed in the integrated circuit having several millimeters square by employing, for example, a chip size package (CSP). To configure frequency synthesizer 30 of such a circuit scale, it becomes possible to incorporate frequency synthesizer 30 within a custom chip or ASIC (application specific integrated circuit) used in the terminal. Further, by incorporating frequency synthesizer 30 into a VCO chip 10 shown in FIG. 1 as integrated circuit, it is also possible to provide an integrated circuit device having a single output capable of dealing with two bands, and having higher functions than the conventional device.

Typically, though four $\pi/4$ phase shifters are included in one frequency synthesizer 30, it is easy to actualize these phase shifters in an integrated circuit. The reason is that by using a process for monolithic microwave integrated circuit, the phases can be varied arbitrarily by providing a transmission line having an appropriate length. Or, by forming coils and capacitors of distributed constant, it is possible to use a phase shifter with the combinations of such coils and capacitors. It may also be possible to form a coil of lumped constant in a spiral shape, or to form a capacitor of lumped constant by forming an area of appropriate size. It is also possible to use a delay line.

Also, for multipliers 13 and 14 a circuit named Gilbert Cell can be used. The basic Gilbert Cell circuit has a few numbers of transistors and accompanies approximately 10 fixed resistors. Therefore, by incorporating in a monolithic integrated circuit, transistors having uniform relative characteristics can be used in this Gilbert Cell circuit. Accordingly, this Gilbert Cell circuit can function as virtually ideal multiplier, as is well known to those skilled in the art. As described above, because the circuit scale is small, frequency synthesizer 30 can be formed in an integrated circuit.

The inversion/non-inversion alteration switch can easily be obtained by separating a signal into two branches, with one branching signal passing through, while the other being amplified by an inversion amplifier having a gain of 1, and by selecting, with a switch, either one of the paths by control logic. Or, it is easily possible to obtain by inserting a delay line having a phase shift amount of $\pi$, or a transmission line corresponding to the phase shift amount of $\pi$, in one of the paths.

As such, frequency synthesizer 30 enables provision of a miniaturized terminal, with reduced cost and power consumption as well.

Additionally, in FIG. 4, $-\pi/4$ phase shifter 11 and $+\pi/4$ phase shifter 12 are provided against the branching signal having the first frequency $F_U$. However, each phase shift amount in phase shifters 11, 12 is not limited to the value described above. Other phase shift amount may be applicable as far as the two branching signals of the first frequency $F_U$ are mutually phase-shifted by $\pi/2$ (90 degrees). The above description is also applicable to each phase shift amount of phase shifters 15 and 16.

Figure 5:
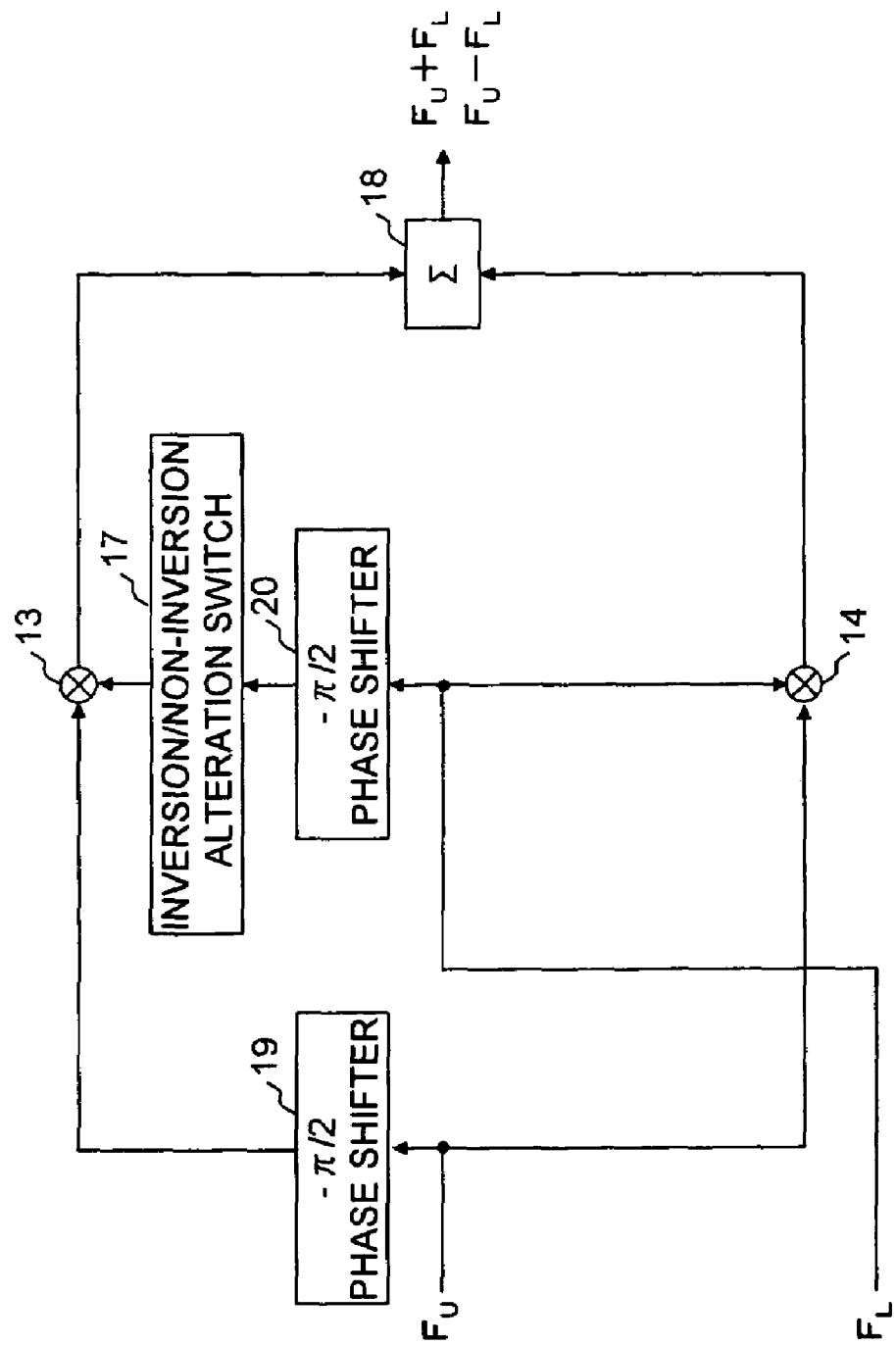
FIG. 5 shows a block diagram illustrating another exemplary configuration of a frequency synthesizer according to an embodiment of the present invention.
Figure 6:
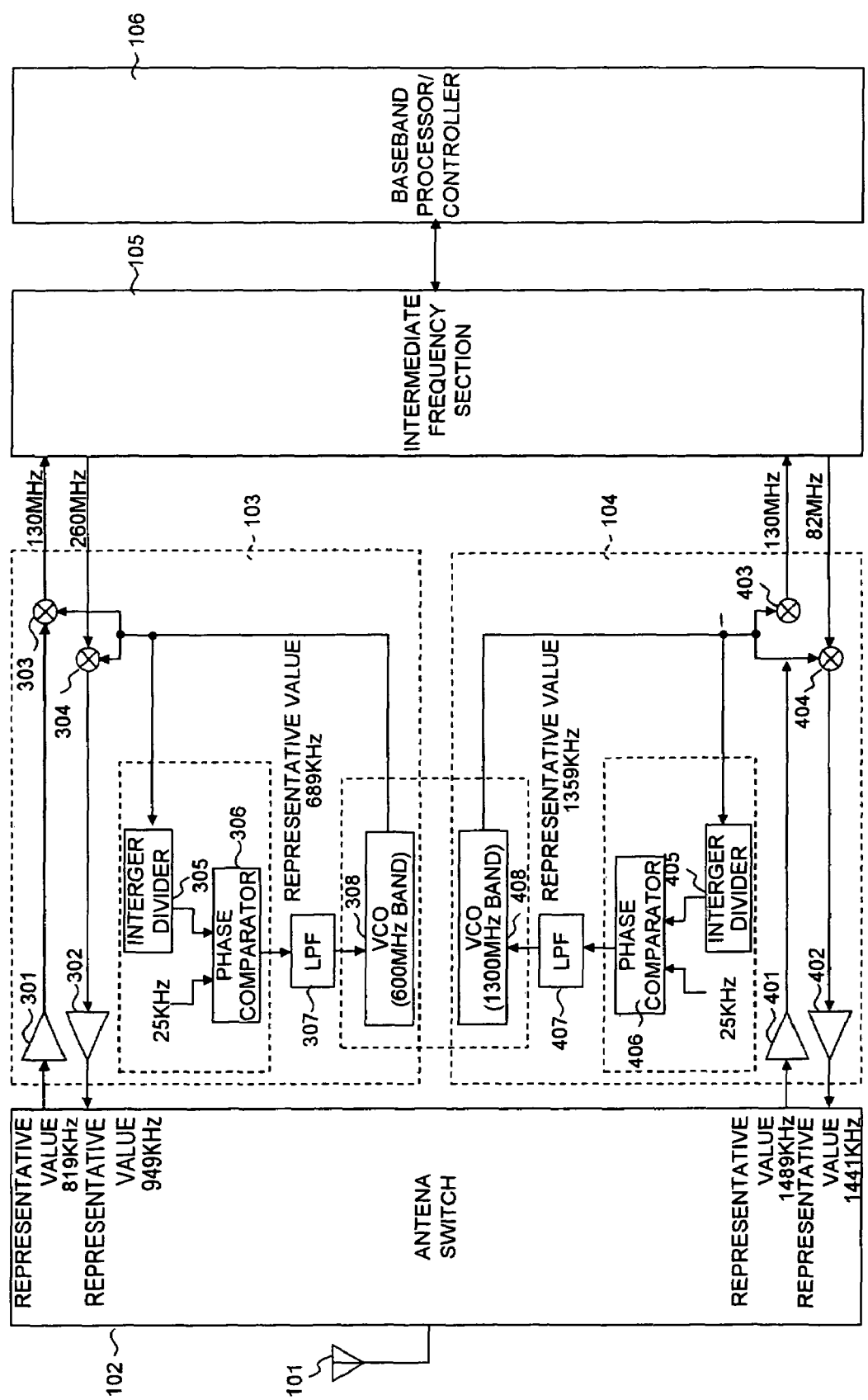
FIG. 6 shows a block diagram illustrating a configuration of a dual-band mobile communication terminal corresponding to the 800M band and the 1.5G band, structured using the conventional art.
Figure 8:
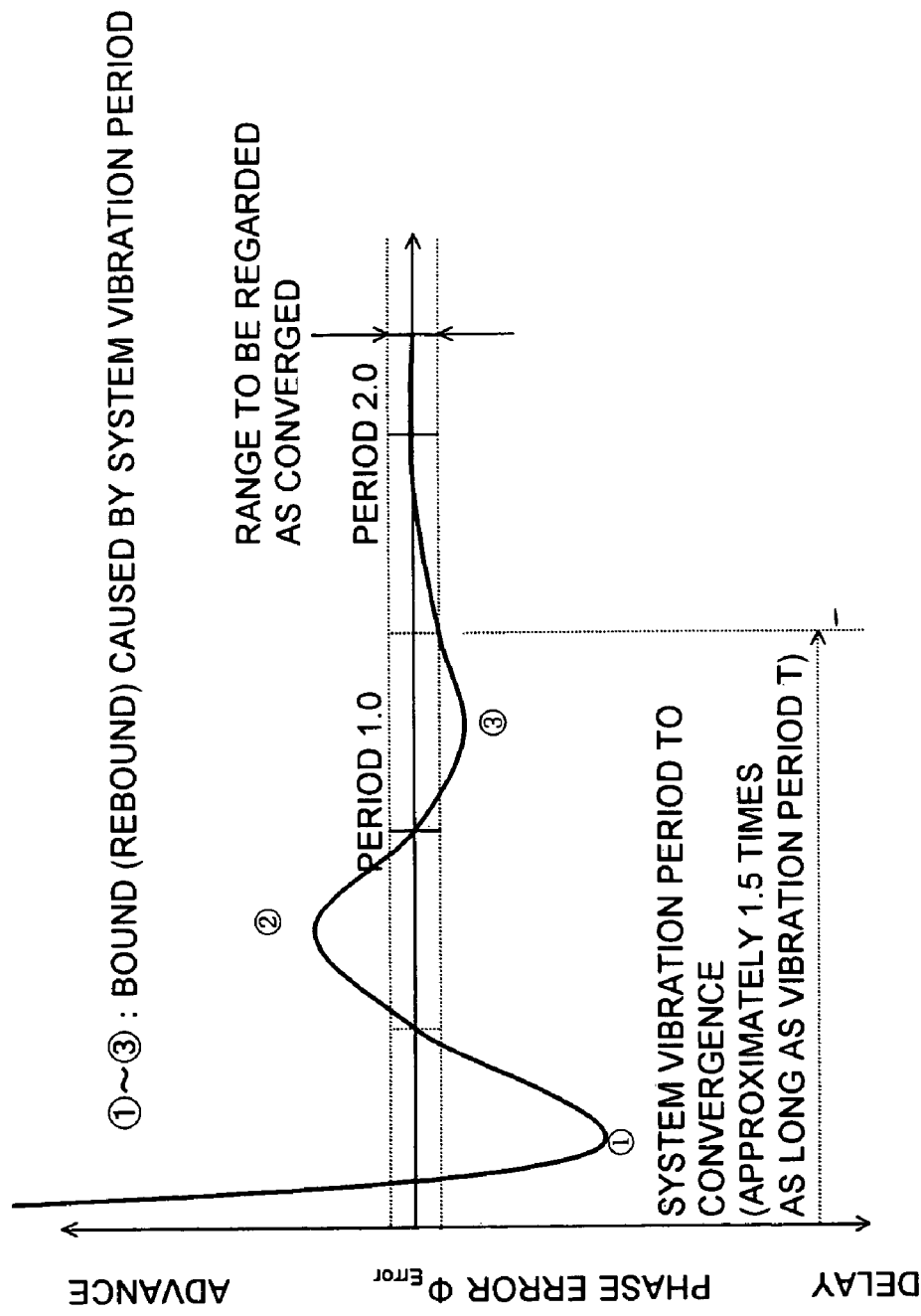
FIG. 8 shows an aspect of convergence in a local oscillator frequency.
Figure 9:
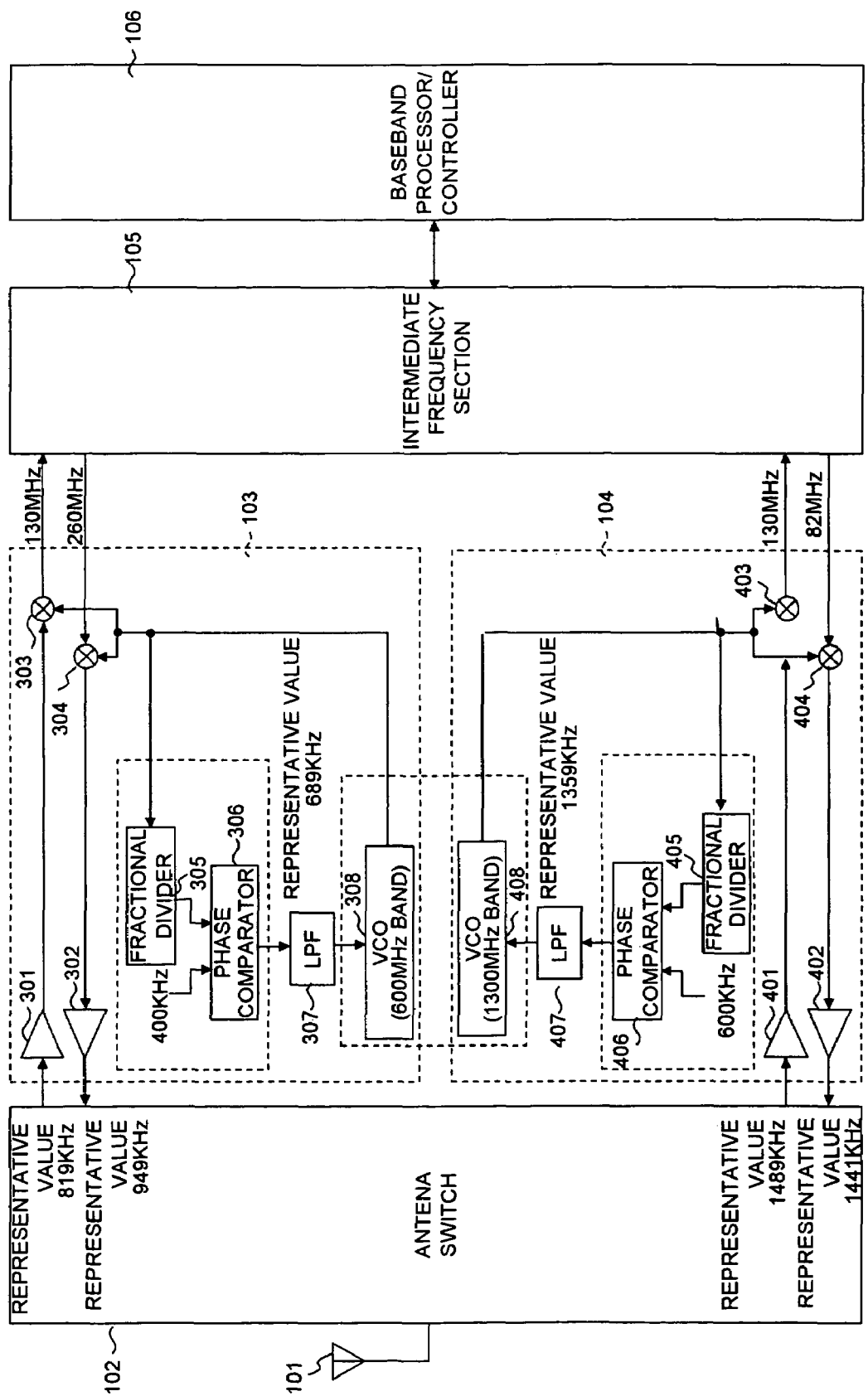
FIG. 9 shows a block diagram illustrating another configuration of a dual-band mobile communication terminal corresponding to the 800M band and the 1.5G band, structured using the conventional art.
Figure 10:
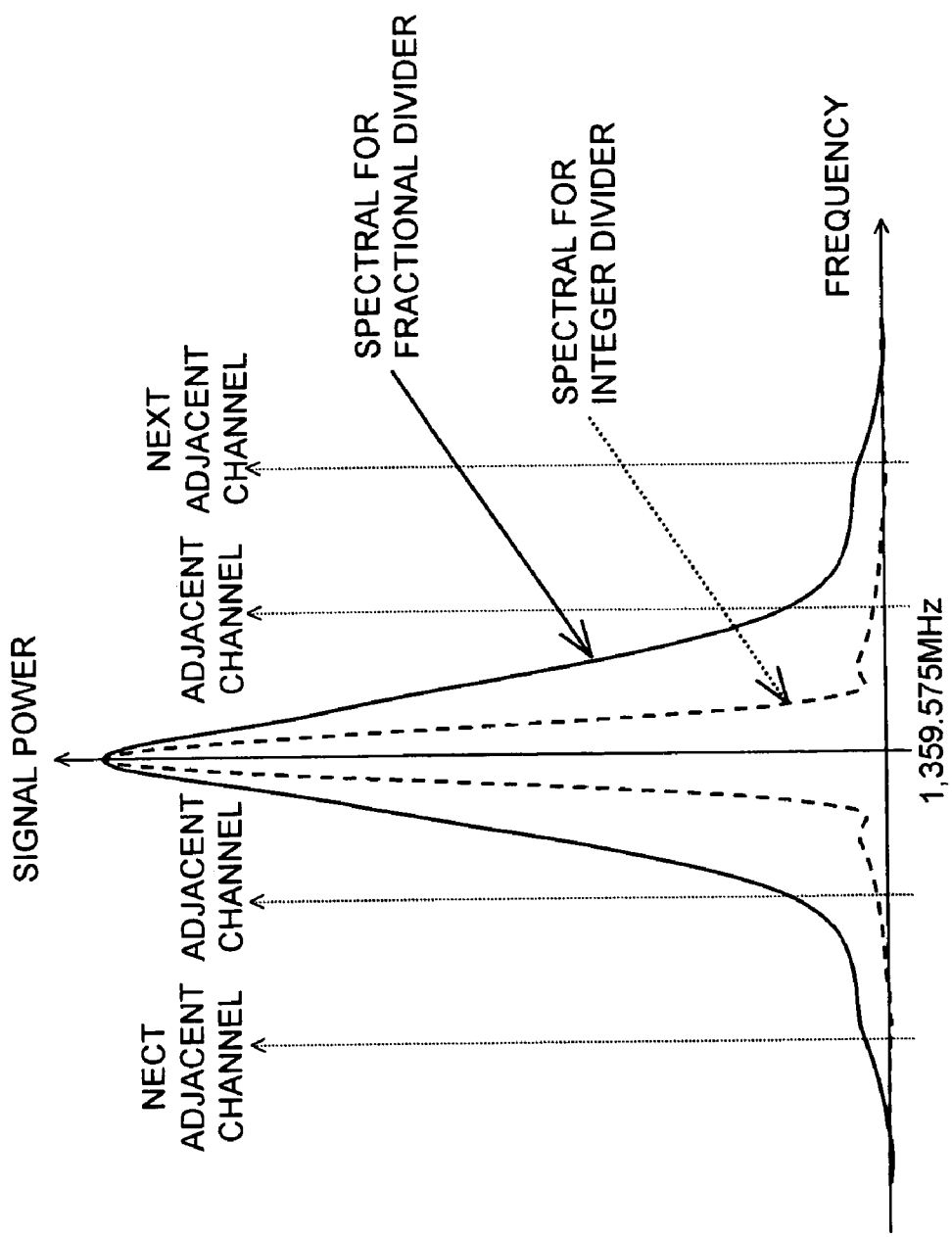
FIG. 10 shows an aspect of deterioration in spectral purity of a local oscillator frequency signal.

Further, as shown in FIG. 5, it is possible to provide $\pi/2$ phase shifters 19 and 20, by which the phase of $\pi/2$ is shifted in only one of the branching signals.

Through the description explained above, a terminal capable of handling the 800M band and the 1.5G band has been disclosed. However, it may also be possible to apply the present invention to other terminals for different bands. For example, the present invention can be applied to a terminal capable of handling the 800 MHz band and the 1.9 GHz band in North America, or a terminal capable of handling the 900 MHz band and the 1.8 GHz band in Europe.

In the above describe of the embodiment, the first frequency is set fixed, and the second frequency is set variable. However, it may also be possible to set both frequencies variable, or to set the first frequency variable with the second frequency fixed.

In addition, when the first frequency is set fixed, the first signal having the first frequency may be obtained by, for example, a crystal oscillator (or, crystal oscillator and a frequency divider), in place of the PLL.

INDUSTRIAL APPLICABILITY

The present invention relates to a local oscillator signal generator and a method for generating a local oscillator signal, and in particular, a local oscillator signal generator and a method for generating a local oscillator signal, thereby generating local oscillator signals including two different frequencies. Such a local oscillator signal generator and a method for generating a local oscillator signal can be used for a dual-band mobile communication terminal capable of dealing with two bands.

According to the present invention, convergence time of a local oscillator signal can be shortened, and accordingly, when the present invention is applied to a dual-band mobile communication terminal, it becomes possible to communicate using two bands switched in real time.

The foregoing description of the embodiments is not intended to limit the invention to the particular details of the examples illustrated. Any suitable modification and equivalents may be resorted to the scope of the invention. All features and advantages of the invention which fall within the scope of the invention are covered by the appended claims.

What is claimed is:

1. A radio equipment generating a signal of a first frequency band by frequency-converting using a signal of a third frequency band, and generating a signal of a second frequency band by frequency-converting using a signal of a fourth frequency band, thereby enabling transmitting whichever signals of the first frequency band and the second frequency band to other radio equipment, said radio equipment comprising:
    a first output section outputting a signal of a predetermined frequency belonging to a band lying between the third frequency band and the fourth frequency band;
    a second output section outputting a signal of a predetermined frequency; and
    a generation and output section generating and outputting, using the signals from the first output section and the second output section, a signal having a frequency equal to the frequency sum of the signals from the first and second output sections, or a signal having a frequency equal to the frequency difference between the signals from the first and the second output sections, respectively as the signal of the third frequency band and the signal of the fourth frequency band.

2. A radio equipment converting a signal frequency of a first frequency band using a signal of a third frequency band, and converting a signal frequency of a second frequency band using a signal of a fourth frequency band, thereby enabling reception of whichever signals of the first frequency band and the second frequency band transmitted from other radio equipment, said radio equipment comprising:
    a first output section outputting a signal of a predetermined frequency belonging to a band lying between the third frequency band and the fourth frequency band;
    a second output section outputting a signal of a predetermined frequency; and
    a generation and output section generating and outputting, using the signals from the first output section and the second output section, a signal having a frequency equal to the frequency sum of the signals from the first and second output sections, or a signal having a frequency equal to the frequency difference between the signals from the first and the second output sections, respectively as the signal of the third frequency band and the signal of the fourth frequency band.

* * * * *